United States Patent [19]
Reine et al.

[11] Patent Number: 4,628,203
[45] Date of Patent: Dec. 9, 1986

[54] NON-DELINEATED DETECTOR HAVING A DIFFERENTIAL READOUT

[75] Inventors: Marion B. Reine, Wellesley; Ronald R. Kusner, Concord, both of Mass.

[73] Assignee: Honeywell, Inc., Minneapolis, Minn.

[21] Appl. No.: 690,908

[22] Filed: Jan. 14, 1985

[51] Int. Cl.$^4$ ............................................. G01L 31/08
[52] U.S. Cl. ..................................... 250/334; 250/370
[58] Field of Search ................. 250/338 SE, 332, 334, 250/370 G, 370 JX

[56] References Cited

U.S. PATENT DOCUMENTS

| | | | |
|---|---|---|---|
| 3,995,159 | 11/1976 | Elliott | 250/334 |
| 4,467,201 | 8/1984 | Blackburn et al. | 250/334 |
| 4,482,807 | 11/1984 | Blackburn et al. | 250/334 |
| 4,531,059 | 7/1985 | McCullough et al. | 250/332 |

Primary Examiner—Carolyn E. Fields
Attorney, Agent, or Firm—John S. Solakian; Albin Medved

[57] ABSTRACT

The present invention is an improvement on the thermal imaging detector of Elliott (U.S. Pat. No. 3,995,195). This detector, which has come to be called the SPRITE detector (Signal PRocessing In The Element), is being applied in serially scanned thermal imaging systems for the 8-12 micrometer infrared spectral band. All such SPRITE detectors to date have been three terminal devices, including two bias contacts at either end of the detector, and one additional readout electrode which, together with the nearby bias contact, define the readout zone across which the integrated photoconductive signal voltage is measured. The present invention recognizes that using a bias contact as one of the two readout electrodes can substantially reduce the spatial frequency response of the SPRITE detector. Thus, the present invention utilizes a four-terminal SPRITE detector configuration in which readout is achieved in a differential manner across two voltage probes. The two voltage probes are located far enough away from the bias contacts so that the bias contacts do not degrade the spatial frequency response.

5 Claims, 2 Drawing Figures

NON-DELINEATED DETECTOR HAVING A DIFFERENTIAL READOUT

BACKGROUND OF THE INVENTION

The present invention generally relates to thermal imaging devices and systems, and, more specifically, relates to infrared detectors used in such thermal imaging systems.

Thermal imaging systems are used to convert a focused radiation image, principally in the infrared spectral region, of the temperature and thermal emissivity differences within a given scene into a visible picture. In such systems, the image may be scanned region-by-region over one or more detector devices or elements which transform the infrared radiation into an electrical signal. After suitable amplification and electronic processing, this signal can be used to energize an electrooptic transducer or display, such as a cathode ray tube, to provide a visual picture. The detector elements can be made from a semiconductor material, such as mercury cadmium telluride, so that the electrical signal is obtained as a change in resistivity due to free electrons and holes liberated from the bound molecular structure of the material by the infrared photons.

One such system employs a single detector element over which the whole image is scanned; but improved performance is obtained by using a plurality of detector elements, usually in a line (linear array). The image may be scanned and the elements arranged in such a way that each element samples a separate part of the same image, providing an overall improvement in signal-to-noise ratio as compared with a single element detector. This mode of operation is known as the "parallel scan" mode. Alternatively, the image may be scanned and the elements arranged in such a way that each region or spot of the image is focused onto each element in turn. The signals detected by the individual elements are added together so as to correlate with one another, but the noise associated with each is uncorrelated. Thus, in this mode of operation, which is known as the "serial scan" mode, also provides an overall improvement in signal-to-noise ratio.

For both the parallel scan and serial scan systems, it is necessary to provide at least one electrical lead for each detector element, plus one common lead from the cooling vessel, and one preamplifier for each detector element. The number of electrical leads involved consequently makes encapsulation of the detector elements difficult and expensive to provide, and the number of preamplifiers affect the size, weight and cost of the system. A detector device which minimizes the number of electrical leads and preamplifiers required is shown in U.S. Pat. No. 3,995,159, issued Nov. 30, 1976, entitled "Thermal Imaging Systems", the inventor of which is Charles Thomas Elliott. Such patent describes a single three-electrode linear detector which replaces the conventional linear detector array in a serially scanned thermal imaging system. Such detector described in such patent comprises an elongated semiconductor/photoconductor strip of, e.g., the infrared-sensitive semiconductor material, mercury cadmium telluride. A bias current in the strip is arranged to give a photocarrier drift velocity in the strip which matches the image scanning velocity, thereby giving enhanced signal to noise ratio. The photocarrier pattern which constitutes the detected image is measured as a resistivity change between two readout electrodes positioned at one end of the elongated semiconductor/photoconductor strip. One problem associated with such elongated semiconductor/photoconductor strip is the limited spatial frequency response it provides.

It is, accordingly, a primary object of the present invention to provide a single detector in the form of an elongated semiconductor/photoconductor strip which provides improved frequency response bandwidth.

SUMMARY OF THE INVENTION

These and other objects of the present invention are achieved by providing detector apparatus which includes an elongated strip of semiconductor material which is photoconductive by the generation of electron and hole photocarriers when a radiation image is scanned along the strip. Such detector apparatus also includes a mechanism for applying lengthwise through the strip a bias electric current producing an ambipolar drift of photocarriers in the strip. The bias electric current flows from a first biased contact at one end of the strip to a second bias contact at the other end of the strip. The velocity and direction of drift match respectively the velocity and direction of the scanning of the radiation image along the strip. Also included in such detector apparatus are first and second readout electrodes connected to the strip near one end of the strip. The photocarriers in the drift region reach the separation between the readout electrodes in a time less than the average electron-hole recombination time of the semiconductor material. The readout electrodes are located sufficiently far away from the second bias contact such that any blocking effects at such second bias contact do not influence the excess carrier distribution between the readout electrodes. This results in an improvement in the spatial frequency response of the detector.

BRIEF DESCRIPTION OF THE DRAWINGS

The above and other objects of the present invention are achieved in the illustrative embodiments as described with respect to the Figures in which.

DETAILED DESCRIPTION OF THE PREFERRED EMBODIMENT(S)

Figure 1:
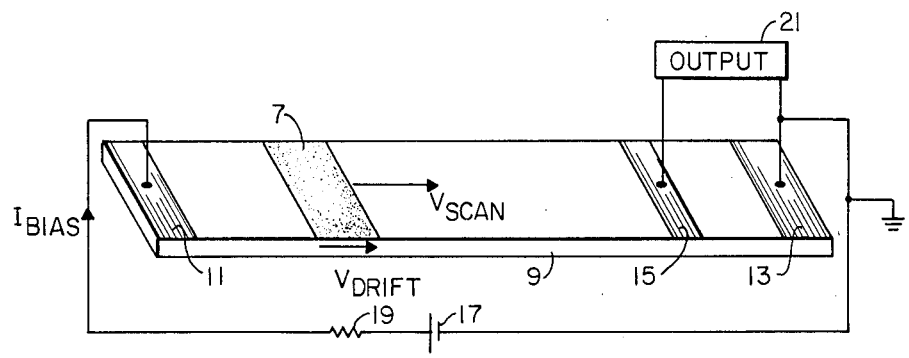
FIG. 1 is an illustration of an integrating infrared detector of the prior art.

The following is a description of the prior art device of FIG. 1 in part as described for the apparatus of U.S. Pat. No. 3,995,159. As shown in FIG. 1, the photoconductive device comprises an elongated strip 9 of semiconductor material having a narrow band gap, e.g., mercury cadmium telluride, indium antimonide or lead tin telluride. The device also comprises two metallic bias electrodes 11 and 13 deposited at opposite ends of the strip 9 and an electrode 15 deposited near the electrode 13. A constant bias current $I_{bias}$ is arranged to flow lengthwise through the strip 9 by a battery 17 connected in series with a load resistor 19 between the bias electrodes 11 and 13. An output or readout circuit 21 is connected between the electrodes 13 and 15, which act as readout electrodes.

Figure 2:
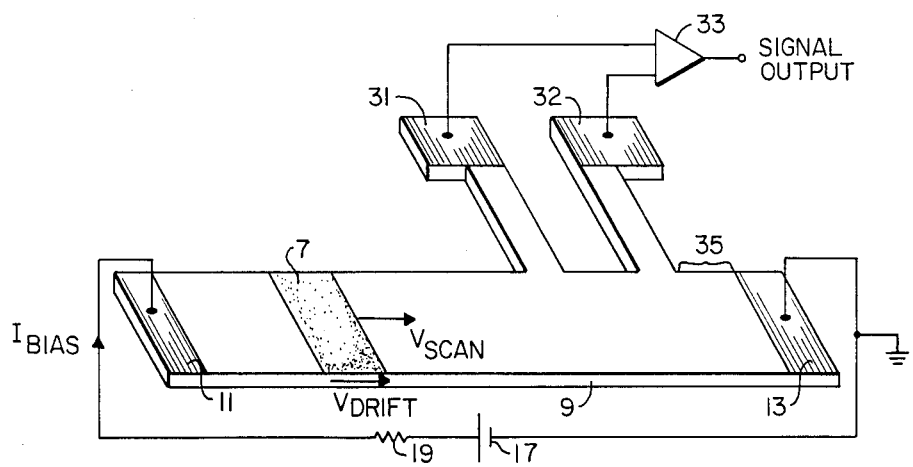
FIG. 2 illustrates, in schematic form, the integrating infrared detector with differential readout of the present invention.

Normally, the strip 9 will be cooled in a liquid nitrogen cooling vessel (not shown in FIG. 1), whereas the battery 17, resistor 19 and the output circuit 21 will be outside the vessel at room temperature. Hence, a conventional encapsulation arrangement (also not shown) is required to isolate these two parts of the device thermally while still providing the appropriate electrical connections between them. As shown in FIG. 2 of the aforementioned patent, an infrared image is projected onto the strip 9 by a conventional scanning and focussing system. Such scanning and focussing system may include, for example, a mirror which is continuously rotatable about a vertical axis, and another mirror which is rotatable in steps about a horizontal axis, and a lens. The system scans a scene in a raster fashion and produces a corresponding infrared image region-by-region on the strip 9 of the device.

The imaging consists of a row of integral elemental image regions corresponding to a row of integral elemental scene regions. The image regions travel along the strip 9 with a velocity $V_{scan}$ by rotation of the mirror which is rotatable about the vertical axis. Images corresponding to the various rows of elemental regions in the scene are projected in turn onto the strip 9 by stepwise rotation of the mirror which is rotatable about the horizontal axis. The polarity of the battery 17 is arranged so that minority carriers drift in the strip 9 in the same direction as that in which the image region 7 travels along the strip 9, i.e., towards the ground bias electrode 13 as illustrated. The resistor 19 and battery 17 are adjusted so that the bias current $I_{bias}$ provides an ambipolar drift velocity $V_{drift}$ which matches the image scan velocity $V_{scan}$.

The infrared radiation photons forming the image region 7 create electron-hole pairs, i.e., photocarriers, in the region of the strip 9 on which they are incident, thereby increasing the carrier densities locally above their equilibrium values. Since the excess minority carriers drift towards the electrode 15 with a drift velocity $V_{drift}$ which matches the scan velocity, the minority carrier density corresponding to the image region 7 increases continuously during transit towards the electrode 15. The rate of generation of electron-hole pairs along the path of the image region 7 will depend on the photon flux in the image region 7. Thus, the excess minority carrier density at any given point along the travel path of the image region 7 modulates the local conductivity by an amount which is a measure of the intensity of the image region 7. Since the bias current $I_{bias}$ is constant, the conductivity (and, hence, resistivity) modulation within the strip 9 will give rise to a local electric field variation. The local field variation in the strip 9 corresponding to the image region 7 and each other identical image regions (not shown) is picked up as a voltage change between the electrodes 15 and 13 and is amplified and processed by the output circuit 21 in a conventional way to provide a picture signal.

The present invention is a significant improvement to the thermal imaging detector of Elliott (U.S. Pat. No. 3,995,159). This detector, which has come to be known as the SPRITE detector (for Signal PRocessing In The Element) is presently being manufactured for use in serially scanned thermal imaging systems. The semiconductor material from which most, if not all SPRITE detectors have been fabricated to date, is the alloy mercury cadmium telluride ($Hg_{1-x}Cd_xTe$) with an alloy composition near x=0.2, chosen to match the detector spectral response at the temperature 77K to the 8-14 micrometer atmospheric window.

In the prior art device shown in FIG. 1, readout of the photogenerated excess carrier disturbance was accomplished by sensing the change in voltage which appeared across the two readout electrodes 13 and 15 shown in FIG. 1, or, alternatively, by collecting the photogenerated minority carriers (i.e., holes for the case of an n-type $Hg_{0.8}Cd_{0.2}Te$ strip or bar) by a narrow p-on-n junction located near the end contact. All SPRITE detectors reported to date have used the first of these two readout schemes in the three-terminal configuration illustrated conceptually in FIG. 1.

The present invention recognizes that the use of the ground bias contact 13 as one of the two readout electrodes can degrade the performance of the SPRITE detector. This degradation manifests itself as an additional smearing out of the image being scanned along the SPRITE detector. It arises because the photogenerated excess carriers remain too long in the readout zone as a result of either blocking of minority carriers at the ground contact or an increase in the effective length of the readout zone due to contact resistance effects.

The length of time the photogenerated excess carrier pulse remains within the readout zone is critical to the performance of a SPRITE in a thermal imaging system. This readout time should be long enough so that an appreciable output signal voltage appears across the readout electrodes, but also short enough so that the smearing of the image does not occur in the readout zone. If the photogenerated excess carrier pulse due to a given scene element remains too long in the readout zone, it will mix and become indistinguishable with an adjacent excess carrier pulse generated from an adjacent scene element, and the spatial frequency response of the imaging system will be degraded.

There are two characteristic properties of metal contacts to n-type $Hg_{0.8}Cd_{0.2}Te$ material which can increase the readout time significantly, and thus reduce significantly the spatial resolution of a SPRITE detector. First, many metal contacts, while ohmic for majority carriers (i.e., electrons), can be partially blocking for minority carriers (i.e., holes). This is due to the $n^+-n$ "high-low" barrier which results for certain contact metals and contact formation processes. A partially blocking ground contact will increase the time which photogenerated carriers spend in the readout zone. Second, the readout zone can extend appreciably beneath the planar metal ground contract as a result of current crowding and/or a finite interface resistance between the contact metal and the semiconductor material.

The present invention therefore provides a new readout technique for a SPRITE thermal imaging detector. This new readout technique, illustrated in schematic form in FIG. 2, includes two voltage probes 31 and 32, across which the signal voltage is measured by an ac-coupled low-noise preamplifier 33. The second voltage probe 32 is located a distance 35 away from the ground bias electrode 13, such that any blocking effects at ground bias electrode 13 do not influence the excess carrier distribution between the voltage probe readout electrodes. In practice, this separation only needs to be equal to or greater than, or preferably several times, the upstream diffusion length $L_u$ defined by $$\frac{1}{L_u} = \frac{\sqrt{\delta^2 + 1} - \delta}{L_a}$$

where $L_a$ is the ambipolar diffusion length and $\delta$ is $V_{drift}/\tau$, where $\tau$ is the minority carrier lifetime and $V_{drift}$ is the ambipolar drift velocity. Typically, $L_u$ is on the order of one to two micrometers.

It should be understood that the schematic representation of the present invention may have been illustrated in the same manner as that shown in FIG. 1. More particularly, the readout voltage probes 31 and 32 may have been shown in the same manner as the readout electrodes 13 and 15 of FIG. 1. It should also be understood that several other implementations may be used to couple such readout probes to the strip without departing from the spirit and scope of the present invention.

Having described the invention, what is claimed as new and novel and for which it is desired to secure Letters Patent is:

1. In a thermal radiation imaging system comprising detector means and scanning means for scanning a thermal radiation image across said detector means, a radiation detector comprising:

an elongated strip of semiconductor material which is photoconductive by the generation of electron and hole photocarriers when said radiation image is scanned along said strip, said strip having first and second ends;

a first contact at said first end and a second contact at said second end;

means for applying lengthwise through said strip, between said first contact and said second contact, a bias electric current producing an ambipolar drift of photocarriers in said strip whose velocity and direction of drift substantially match respectively the velocity and direction of scanning of said strip;

first and second readout electrodes connected to said strip near said second end of said strip, said strip having an active length and said readout electrodes having a separation such that minority photocarriers in said drift reach said separation between said readout electrodes in a time less than the average electron hole recombination time of said semiconductor material; and wherein said first and second readout electrodes are spaced from said second contact such that the readout electrode nearest said second contact is located a distance from said second contact which is no less than the upstream diffusion length ($L_u$) of said detector, wherein $L_u$ is defined by the relationship $$\frac{1}{L_u} = \frac{\sqrt{\delta^2 + 1} - \delta}{L_a}$$

where $L_a$ is the ambipolar diffusion length and $\delta$ is the drift velocity ($V_{drift}$) divided by $\tau$, where $\tau$, is the minority carrier lifetime.

2. A detector as in claim 1 wherein the value of $L_u$ is in the range of one to two micrometers.

3. A detector as in claim 1 further comprising means, coupled between said first and second readout electrodes, for providing a signal output indicative of said image.

4. A detector as in claim 1 wherein said second readout electrode is located a sufficient distance away from said second contact such that said photocarrier moves through said readout region without any delay which may be caused by placing said second carrier too close to said second readout electrode.

5. A detector comprising:

an elongated strip of semiconductor material which is photoconductive by the generation of electron and hole photocarriers when an image is moved along said strip, said strip including an active region and a readout region;

said strip including a first contact at one end of said strip and a second contact at the other end of said strip;

said strip including a first readout electrode at the junction of said active region and said readout region and a second readout electrode at the end of said readout region adjacent said second contact and separated therefrom a distance which is no less than the upstream diffusion length ($L_u$) of said detector where $L_u$ is defined by the relationship $$\frac{1}{L_u} = \frac{\sqrt{\delta^2 + 1} - \delta}{L_a}$$

where $L_a$ is the ambipolar diffusion length $\delta$, is the drift velocity ($V_{drift}$) divided by $\xi$, where $\tau$ is the minority carrier lifetime; and means for applying through said active region of said strip a bias electric current producing an ambipolar drift of photocarriers in said strip whose velocity substantially matches the velocity of the movement of said image along said strip.

* * * * *